United States Patent [19]

Woodman, Jr. et al.

[11] 4,161,064
[45] Jul. 17, 1979

[54] MACHINES FOR BOARD MOUNTING AND SOCKET MOUNTING COMPONENTS

[75] Inventors: Daniel W. Woodman, Jr., Beverly; Henry L. Wright, Ipswich, both of Mass.

[73] Assignee: USM Corporation, Farmington, Conn.

[21] Appl. No.: 825,824

[22] Filed: Aug. 18, 1977

[51] Int. Cl.² .............................................. H05K 3/30
[52] U.S. Cl. ...................................... 29/741; 29/626; 29/759
[58] Field of Search .................. 29/741, 739, 759, 626

[56] References Cited
U.S. PATENT DOCUMENTS 4,063,347  12/1977  Woodman, Jr. .................. 29/741 X

*Primary Examiner*—Carl E. Hall
*Attorney, Agent, or Firm*—Carl E. Johnson; Richard B. Megley; Vincent A. White

[57] ABSTRACT

Mechanism is provided whereby a machine for inserting multiple leads of a component into a circuit board may be adapted to first insert a lead-receivable socket into the board and thereafter mount a component in the pre-inserted socket. The mechanism preferably is employed in a machine comprising automatic means for sequencing the components and sockets predeterminedly. When the machine further comprises automatic means for positioning the circuit board to receive the successive components and/or sockets, it is contemplated all components and sockets will first be programmed to be inserted directly into the boards, then preferably after soldering to secure them into board circuitry and remounting of the board in the machine, new programming of the board positioning means will mount the proper component into its pre-inserted and soldered socket.

The novel mechanism is provided, for instance, as an attachment to or auxiliary kit for use in a machine for inserting DIP components and/or sockets. Specifically this attachment comprises a movable stop having two abutment or positioning faces one of which is disposed to engage leading leads of a component and the other of which abuts the leading surface of a socket to be inserted. Mounting of the stop is such that it does not approach the circuit board and hence cannot interfere with it or previously mounted components.

7 Claims, 8 Drawing Figures

1

MACHINES FOR BOARD MOUNTING AND SOCKET MOUNTING COMPONENTS

CROSS-REFERENCE TO RELATED APPLICATION

U.S. application Ser. No. 728,835 filed Oct. 1, 1976 in the name of Daniel Woodman, Jr. now U.S. Pat. No. 4,063,347, relates to a machine for inserting integrated or DIP-type components when sequenced from their respective sources of supply.

BACKGROUND OF THE INVENTION

This invention pertains to machines for mounting electronic components into circuit boards or the like. More especially, it relates to machines adapted to mount components and sockets, separately, directly into circuit boards, and thereafter, with slight modification provided by this invention, to insert appropriate components into their previously inserted sockets.

Several U.S. patents have disclosed machines for inserting multi-lead components, for instance U.S. Pat. Nos. 3,550,238; 3,591,040; and 3,727,284. When electronic components have their leads clinched to interconnect to board circuitry, convenient removal of a component which may prove faulty is difficult and not convenient. Mounting of a suitable socket and soldering of such socket to a circuit board, on the other hand, enables the component thereafter inserted by its leads endwise into the socket to be manually removed for testing and or convenient replacement, the pre-inserted socket remaining connected to the board.

As disclosed in the pending application cited above, multi-lead or integrated circuit type components are often automatically sequenced for desired order of insertion. The present invention enlarges the utility of component inserting machines of the general type there disclosed by enabling them conveniently and simply to be adapted to initially sequence and mount sockets as well as components, and thereafter to insert usually by program, components into the previously installed sockets.

SUMMARY OF THE INVENTION

In view of the foregoing it is an object of this invention to provide in a machine for inserting multi-lead sockets and/or components directly into circuit boards, mechanism operable in another cycle of the machine to insert components into the pre-inserted sockets.

For mounting a component into a pre-inserted socket, the invention contemplates easy conversion by rendering inoperative a lead cut-clinch mechanism, providing means to shorten the inserting stroke, and employing a movable stop member having two spaced positioning faces one of which abuts the leading end of a socket and the other of which is arranged to abut leading leads of a component insertable into the socket. The invention, though simple in structure, thus accommodates the greatly expanded use of sockets to protect components from the soldering process as well as facilitate their removal when necessary.

BRIEF DESCRIPTION OF THE DRAWINGS

The above and other features of the invention will now be more particularly described in connection with an illustrative embodiment, and with reference to the accompanying drawings thereof, in which.

DESCRIPTION OF PREFERRED EMBODIMENT

While the present invention is well adapted for, and by way of illustration will be described in relation to, the insertion and mounting of dual-in-line type of components (hereinafter referred to as DIP's) and sockets therefor, it will be understood that application of the invention is not necessarily thus limited.

Figure 1:
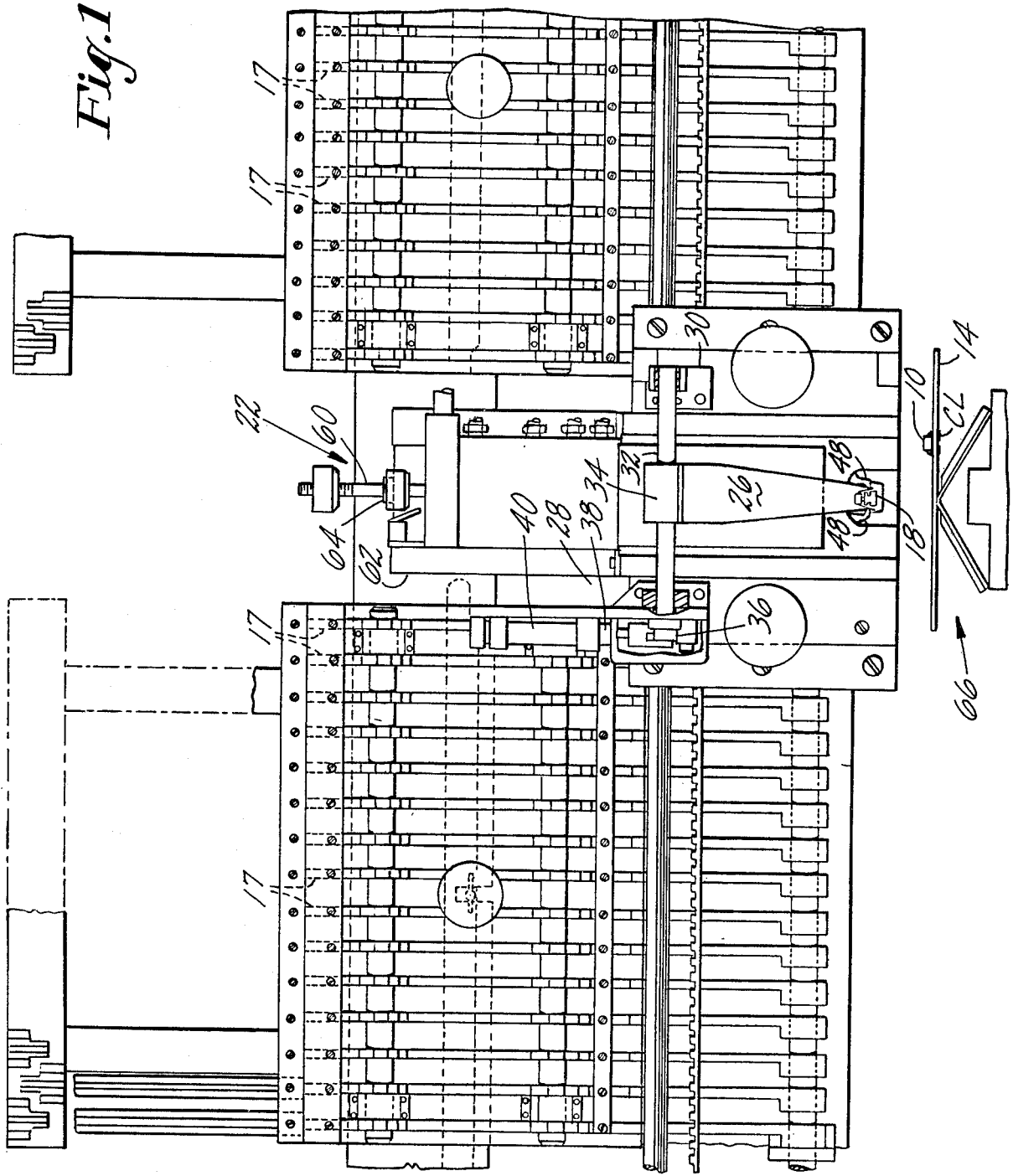
FIG. 1 is a view in front elevation of a DIP and socket sequencing and inserting machine, the view largely corresponding to FIG. 2 of the Woodman application above cited except that an attachment shown in the illustrative machine makes it adaptable to also insert the components in sockets previously inserted thereby in circuit boards.

For purposes of convenience the illustrative machine shown in FIG. 1 may be assumed in many respects essentially to correspond with that disclosed in U.S. Pat. No. 3,550,238 or in the application Ser. No. 728,835 referred to above, except in the novel particulars to be particularly described herein relating to the present invention. Accordingly in this preferred embodiment a selected DIP (10) or a socket 12 for mounting the component 10 in a support such as a circuit board 14 is, according to predetermined programming, delivered by a transfer mechanism generally designated 16 onto a reciprocable, substantially horizontal mandrel or bar 18. For this purpose, it will be understood that vertical raceways 17 (FIGS. 1 and 2) respectively and sequentially deliver the DIP's 10 and/or sockets 12 successively, as programmed, to a picker assembly designated 10 (FIG. 2) laterally shiftable to deposit them (via lead reforming and presence detecting means, if desired) endmost into a chute 21 aligned with the bar 18. The mechanism 16 further comprises a spring-pressed plunger or take-up 20, (FIG. 2) for slidably urging the delivered component 10 or socket 12 forwardly on the bar 18 to a position beneath vertically operable inserting means 22 which may be of conventional type hitherto disclosed. Accordingly it will be understood that by cyclical operation of a double acting piston of an air motor 24 (FIG. 2) controlling transfer movements of the bar 18, the rearwardly yieldable plunger 20 affixed thereon abuts each component body or socket, as the case may be, and urges it forwardly relative to the bar. Substantially at the same time the component or socket is thus coming forwardly a stop positioning means in the form of a pivotal arm 26 (FIGS. 1-5, 7, 8) is being swung rearwardly into work abutting or operating position for purposes about to be explained.

The stop arm 26 and its actuating means constitute an attachment which, together with a few additional parts later referred to, enable the machine not only to insert DIP's into circuit boards as heretofore, but also to insert sockets into such boards and, preferably when the sockets have been soldered thereto, to then respectively mount DIP's into the soldered sockets. For this purpose that attachment includes a pair of laterally spaced supports 28,30 (FIGS. 1 to 3) secured to a stationary or frame portion of the inserting head 22. These supports rotatably carry a horizontal shaft 32 to which there is centrally affixed a clamping block 34 detachably mounting the depending stop positioning arm 26 to be later described in greater detail.

Figure 2:
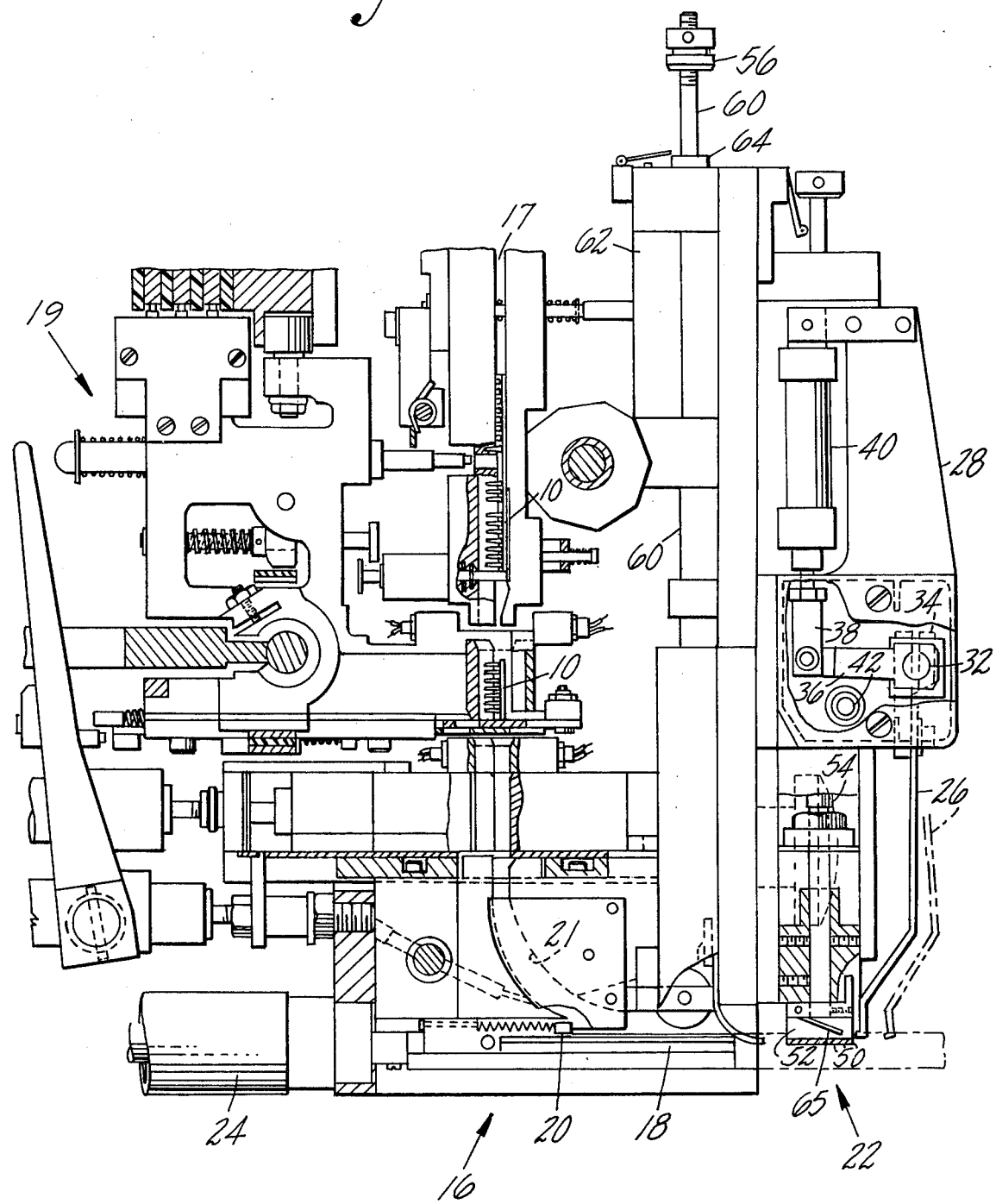
FIG. 2 is a view in side elevation (corresponding largely to FIG. 8 of the above-mentioned Woodman application) and showing mounting and actuating means for the attachment assembly, a positioning stop finger thereof being indicated in different positions.
Figure 3:
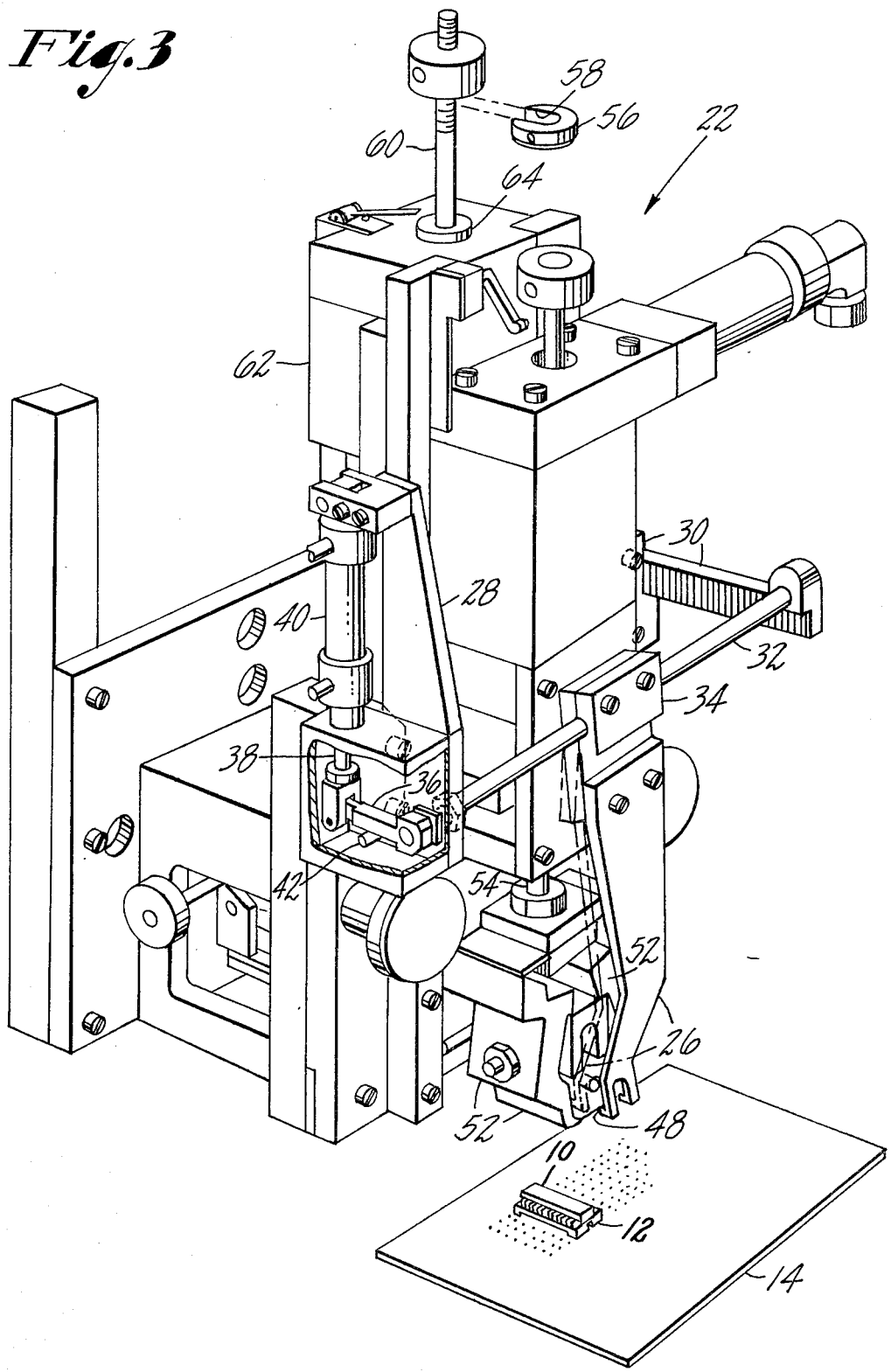
FIG. 3 is a perspective view of the attachment shown in FIG. 2, portions being broken away to reveal structural detail.
Figure 4:
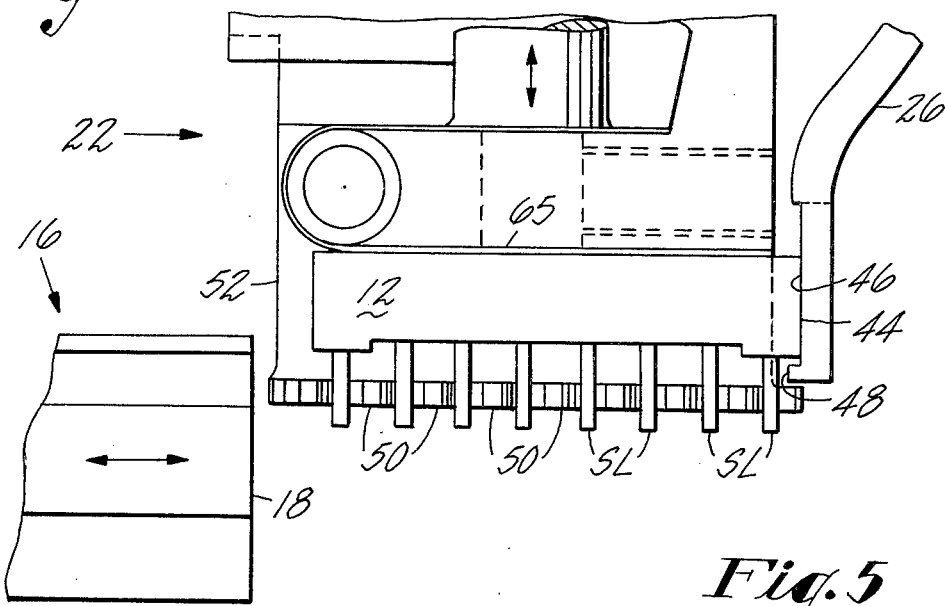
FIG. 4 is an enlarged side view of the stop finger positioning, relative to a lead guide, a socket about to be inserted.

The lower end of the arm 26 is arranged to yieldingly swing rearwardly for endwise engagement with a socket 12 or component 10 on the bar 18 as the latter is guiding the socket or component forwardly under the influence of the plunger 20. As shown in FIGS. 1-3, an end of the shaft 32 is connected by a crank arm 36 to the lower end of a piston rod 38 of a double-acting air cylinder 40, the latter being affixed to the support 28. Inward positioning movement of the arm 26 is always to a predetermined position established by the limit of upward position of the rod 38; outward movement of the arm 26 is determined by engagement of the arm 36 during its counterclockwise movement (as seen in FIG. 2) with a stop 42 secured to the support 28.

Figure 5:
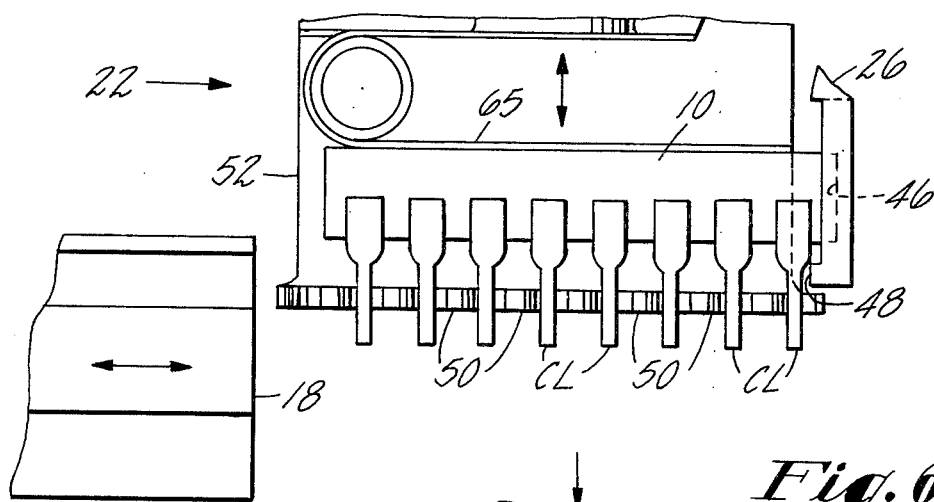
FIG. 5 is a view similar to FIG. 4 and showing the same finger indicated in FIG. 4, positioning a DIP component for insertion, either in a circuit board or in a previously installed socket therefor.
Figure 8:
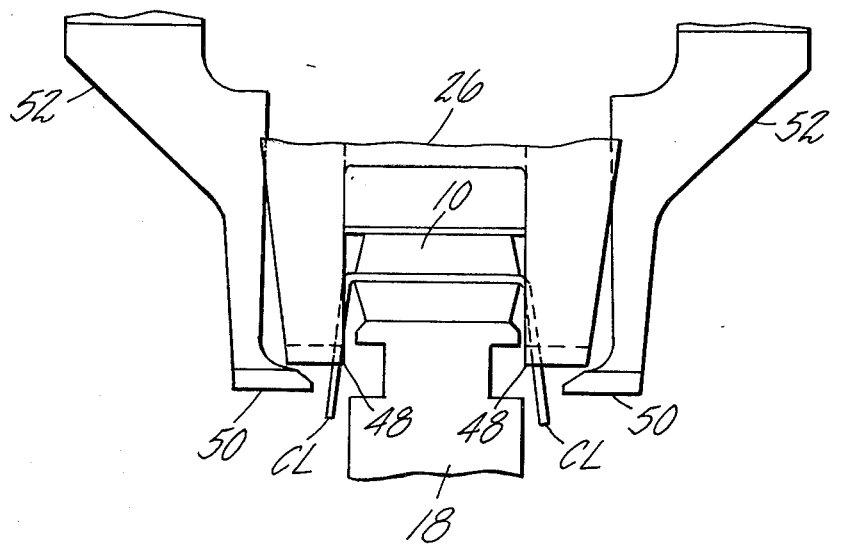
FIG. 8 is similar to FIG. 7 but illustrates the finger now acting to position the component endwise preliminary to insertion into a previously positioned and inserted socket.

Focusing now on the lower or work-engaging end of the arm 26, and with particular reference to FIGS. 3-5, 7 and 8, this end is forked and formed so that it can position (for vertical insertion) successive sockets 12 by engaging their leading end faces 44 (for vertical insertion) and also can position successive DIP's (for vertical insertion) by engaging their leading, i.e. front, leads CL, CL, as shown in FIG. 8. More specifically, rearward, recessed surfaces 46,46 (FIG. 4) of the forked portion of the arm 26 are arranged to abut the leading end face 44 of the socket 12 which is wider than the width of the component body 10; and rearward, laterally spaced projecting tips 48,48 (FIG. 5) of the arm 26 (offset lengthwise of the component from the surfaces 46) are arranged to abut leading component leads CL, CL (as shown in FIG. 5) as the narrower end face of the component 10 extends between the surfaces 46. The arm 26 is thus automatically able to position both leads CL and SL, respectively, as the case may be, so that they will be presented appropriately to the plurality of closeable pairs of spaced fingers 50 constituting vertical lead guiding means 52 of the inserting head 22. The fingers are aligned with lead receiving holes H of the board 14 (FIG. 3) when the latter is correctly X-Y positioned with respect to the head 22. It may be noted that the fingers 50 correspond to the lead guiding fingers 111 of the members 110 disclosed in the U.S. Pat. No. 3,550,238.

Figure 6:
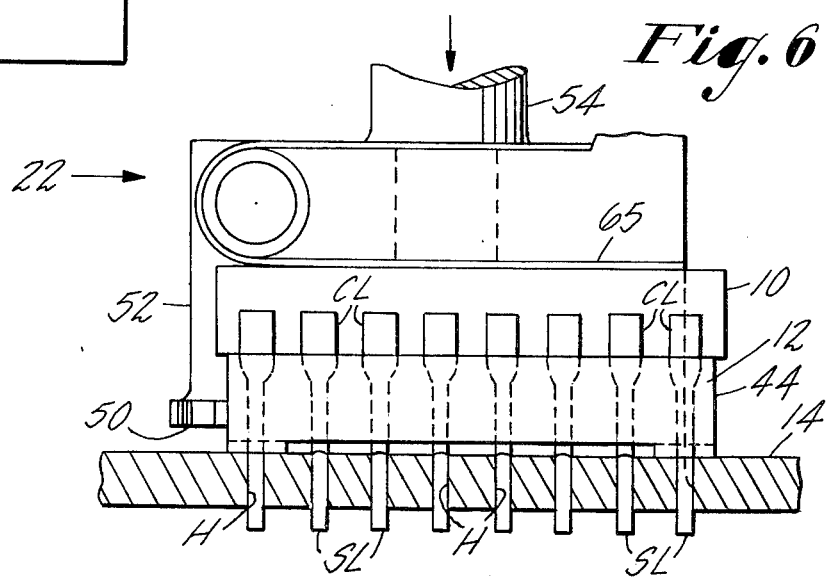
FIG. 6 is similar to FIGS. 4 and 5 but showing, at a later stage in a cycle, insertion of the component into a socket previously inserted by the machine in a circuit board.
Figure 7:
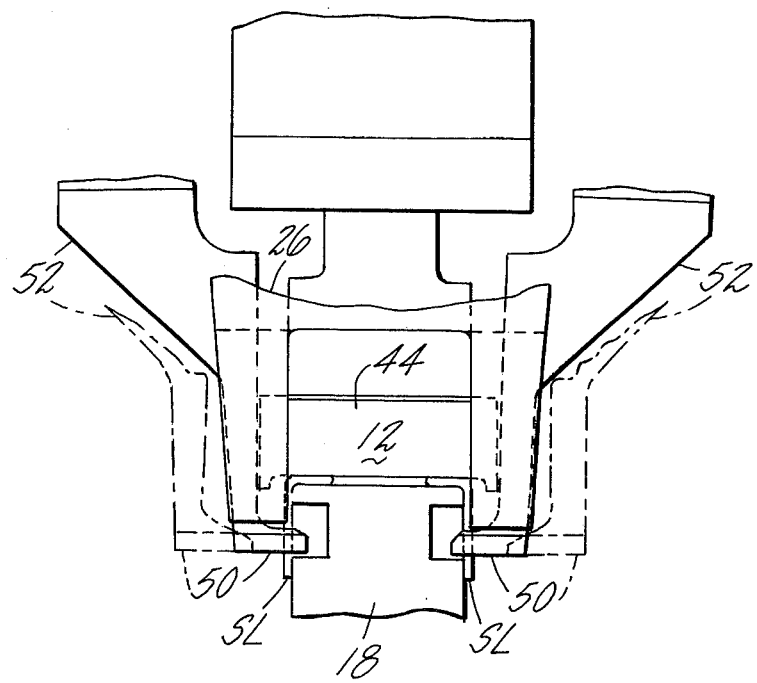
FIG. 7 is a further enlarged detail, in front elevation, of the finger cooperating with a transfer mandrel to position a socket.

When the component 10 or socket 12 has been positioned endwise on the bar 18 as indicated, the fingers 50 which have been in non-interferring or open position are closed by pivoting of the means 52 to laterally grip the component or socket as hitherto disclosed, and the bar 18 is retracted rearwardly. As the bar 18 is removed from beneath the head 22 by the motor 24, the positioning arm 26 is swung forwardly by the motor 40 to an out-of-the-way position indicated by dash lines in FIG. 2. The head 22 can then move its driver 54 and guide means 52 toward the board 14 to insert therein the component or the socket, or to mount the component 10 into a previously inserted socket 12 as shown in FIG. 6. It is important to note that the positioning arm 26 does not move toward the board 14 during insertions and accordingly cannot interfere with any previously mounted elements on the circuit board.

Since the driver 54 (which corresponds to the rod 132 of the mentioned U.S. Pat. No. 3,550,238) requires a smaller downstroke for inserting component leads CL into a previously inserted socket 12 on the board 14 than when inserting leads of sockets or components directly into the board, a detachable spacer 56 (FIGS. 2, 3) have an open-ended slot 58 and fitted with a set screw is provided and is mountable on a piston rod 60 of a usual double acting air cylinder 62 for reciprocating the rod 60 to operate the head 22. It will be understood that, when used, the spacer 56 suitably decreases downward motion of the inserter or driver 54 by abutting a neoprene bumper 64 which abuts cylinder housing 62.

It will further be apparent that leads CL which are receivable in the pre-inserted socket 12 need not be clipped and clinched. Accordingly, means (such as a switch not herein shown) is provided for rendering a clip-clinch mechanism 66 (FIG. 1), for instance such as disclosed in U.S. Pat. No. 3,986,533, inoperative when using the machine to mount DIP's in their pre-inserted sockets. Upon reopening of the fingers 50 while a now-compressed leaf spring 64 of the head 22 is urging the inserted socket 12 or component 10 toward the board, the head 22 is retracted upwardly by pressure in the cylinder 62, leaving the component or socket installed.

Operation of the machine as adapted for inserting the DIP components 10, as sequenced by predetermined program, and into their previously programmed and inserted sockets 12, will now be briefly reviewed. The cut-clinch means 66 will be made inoperative, and the spacer 56 will be located on the piston rod 60 suitably to decrease the downward inserting stroke of the driver 54 since each DIP to be socket-mounted will be similarly spaced from the board 14 by their respective sockets. It will be understood that generally all sockets and components to be directly mounted in the boards 14 will have first been soldered to their circuits, and then all other components will be inserted according to program in their previously inserted sockets. If there is a change in the height of sockets to be employed, it will be apparent that a spacer 56 of suitably modified thickness will be employed.

The picker assembly 19 will have provided a selected DIP for descent in the raceway 17 for delivery via the chute 21 onto the bar 18, the leads CL extending downwardly on opposite sides of the bar. The air cylinder 24 is pressurized to forwardly advance the bar 18 with its plunger 20, the latter urging the DIP between the then-open fingers 50. As the DIP is thus urged endwise forwardly, i.e. to the right in FIG. 2, and beneath the free portion of the spring 65, the air cylinder 40 is pressurized to move its rod 38 upward and hence shift the forked lower end of the arm 26 clockwise. The projecting tips 48,48 of that arm accordingly engage the respective front or leading end leads CL of the leads of the component as shown in FIG. 5. It will be noted that the recessed faces 46 of the arm 26 do not interfere with such positioning and alignment of the leads CL with the fingers 50, and hence with corresponding socket holes of the receiving or pre-inserted socket 12, faces 46 being spaced widthwise more than the width of the DIP. The plunger 20 yields rearwardly as necessary to enable the positioning arm 26 to give effect to the full upward stroke (which may be adjustable) of the rod 38.

Having positioned the DIP accurately relative to the guide means 52 and endwise on the bar 18, the latter and the arm 26 are oppositely retracted from the component as soon as the fingers 50 have closed widthwise on the DIP. Now the driver 54 moves toward the board 14 as shown in FIG. 6 to cause the fingers 50 to guide and thrust the component leads CL into their respective receiving holes of the preinserted socket 12. Opening of the fingers 50 and retraction of the driver and the fingers is then effected. While the board 14 is being positioned for new alignment with the inserting head 22, preferably as called for by suitable programming means controlling, for instance, an X-Y board-carrying table (not shown), the picker assembly 19 is being actuated to prepare for the next sequenced cycle of operations. It will be apparent from the foregoing that the invention greatly increases the utility and value of computer controlled machines for sequencing and inserting components and their sockets.

We claim:

1. In a machine for separately inserting in circuit boards both successive electronic components and sockets for mounting said components, the components and sockets respectively having a body and dual in-line leads extending in parallel therefrom and the sockets having portions shaped to receive the component leads endwise, said machine having an inserting means and a means for releasably supporting each socket or component above a board and in alignment with the inserting means, first mechanism operative to mount a component in a socket preinserted by the machine, said mechanism comprising a device movable into and out of cooperative relation with the supporting means to align leads of the component with the lead receiving portions of the pre-inserted socket, said device comprising a member having one portion formed to engage and position a face of the socket when on the supporting means and another portion formed to engage and position end leads of the component when on the supporting means in predetermined offset relation to said positioned face of the socket, and other mechanism for operating said member in time relation to said inserting means.

2. A machine as in claim 1 wherein said first operative mechanism includes a means for decreasing the inserting stroke of said inserting means.

3. For use in a machine having instrumentalities for inserting the leads of multi-lead components and sockets for said components successively into a circuit board, an assembly for mounting on the frame of the machine, said assembly comprising a pair of laterally spaced supports, a positioning member movably carried by said supports for movement remote from the board between an inoperative position and a component and socket engaging positions for predeterminedly aligning their respective leads with respect to the inserting path of the inserting instrumentalities, and actuating mechanism for controlling the member cyclically in relation to the operation of said instrumentalities whereby, on occasion, engagement by the member with leads of a component will position them for insertion by the instrumentalities in a socket previously installed thereby in the board.

4. An assembly as in claim 3 including a spacer for limiting the operating stroke of said instrumentalities.

5. In a machine having means for inserting the leads of electronic components and their sockets into preformed holes of a circuit board, said sockets being formed with holes for receiving component leads, mechanism for inserting the leads of the respective components into the lead-receiving holes of the sockets having their leads previously inserted into the board holes by the machine, said means comprising closeable lead guiding fingers movable toward and from the board, said mechanism comprising a positioning member movable into engagement with a socket or a component, as the case may be, for aligning the leads of each component and socket with said fingers, and said member being formed with a surface to abut a face of the socket and a portion projecting from said surface to positionally abut a lead of the component without interference engagement with its body.

6. A machine as in claim 5 wherein said mechanism further comprises a horizontally reciprocable bar for slidably supporting each socket and component to be mounted, a means for urging each individual socket and component in one direction along the bar and between the fingers when open, and said member is an arm having a forked end engageable with the component and a socket therefor, the forked end having a first surface formed and arranged relative to said bar to engage a face of a socket on the bar and another surface formed and arranged to engage and position a lead of a component on the bar a predetermined offset distance from said socket face, said other surface being non-engageable with said first surface.

7. The mechanism of claim 6 wherein the machine includes a frame, said arm is pivoted thereto for movement out of intereference relation to the board and to components on the board, and mechanism actuatable by said inserting means for operating said arm in time relation thereto.

* * * * *